United States Patent
Son

(10) Patent No.: US 10,460,769 B2
(45) Date of Patent: Oct. 29, 2019

(54) MEMORY DEVICE INCLUDING ERROR DETECTION CIRCUIT

(71) Applicant: Samsung Electronics Co., Ltd., Suwon-si, Gyeonggi-do (KR)

(72) Inventor: Jong-pil Son, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/681,885

(22) Filed: Aug. 21, 2017

(65) Prior Publication Data

US 2018/0053535 A1    Feb. 22, 2018

(30) Foreign Application Priority Data

Aug. 22, 2016   (KR) ........................ 10-2016-0106168

(51) Int. Cl.
*G11C 5/04* (2006.01)
*G01R 31/3185* (2006.01)
(Continued)

(52) U.S. Cl.
CPC ........ *G11C 5/04* (2013.01); *G01R 31/318513* (2013.01); *G01R 31/318555* (2013.01);
(Continued)

(58) Field of Classification Search
CPC ....... G11C 7/1006; G11C 7/1051; G11C 7/18; G11C 7/1012; G11C 29/023;
(Continued)

(56) References Cited

U.S. PATENT DOCUMENTS

| 5,159,598 A | 10/1992 | Welles, II et al. |
| 6,397,361 B1 | 5/2002 | Saitoh |

(Continued)

FOREIGN PATENT DOCUMENTS

| JP | 2000-183739 A | 6/2000 |
| KR | 10-2003-0020124 A | 3/2003 |

(Continued)

OTHER PUBLICATIONS

Strom, "Designing a Seamless Processor Interface Using FIFO Bus Matching and Byte Swapping," Advanced System Logic, 1994, Texas Instruments.

*Primary Examiner* — Tha-O H Bui
*Assistant Examiner* — Alfredo Bermudez Lozada
(74) *Attorney, Agent, or Firm* — Harness, Dickey & Pierce, P.L.C.

(57) ABSTRACT

A memory device includes a first memory cell array connected to a first internal data line; a second memory cell array connected to a second internal data line; and a line swap circuit configured to connect the first and second internal data lines with first and second external data lines based on an externally received driving signal. The line swap circuit is configured such that, when the driving signal has a first logic level, the line swap circuit connects the first and second internal data lines with the first and second external data lines, respectively, and when the driving signal has a second, different logic level, the line swap circuit swaps the first and second external data lines so that the first internal data line is connected to the second external data line and the second internal data line is connected to the first external data line.

10 Claims, 10 Drawing Sheets

(51) Int. Cl.
*G06F 12/02* (2006.01)
*G11C 7/10* (2006.01)
*G11C 7/18* (2006.01)
*G11C 29/02* (2006.01)
*G11C 29/12* (2006.01)
*H01L 21/66* (2006.01)
*H01L 25/065* (2006.01)
*G11C 29/44* (2006.01)
*G11C 29/00* (2006.01)
*G01R 31/3187* (2006.01)

(52) U.S. Cl.
CPC ........ *G06F 12/0207* (2013.01); *G11C 7/1006* (2013.01); *G11C 7/1051* (2013.01); *G11C 7/18* (2013.01); *G11C 29/023* (2013.01); *G11C 29/1201* (2013.01); *G11C 29/4401* (2013.01); *G11C 29/702* (2013.01); *H01L 22/22* (2013.01); *H01L 25/0657* (2013.01); *G01R 31/3187* (2013.01); *G11C 7/1012* (2013.01); *G11C 2029/4402* (2013.01); *H01L 2224/16145* (2013.01); *H01L 2224/32225* (2013.01)

(58) Field of Classification Search
CPC ............ G11C 29/1201; G11C 29/4401; G11C 29/702; G11C 5/04

USPC .......................................................... 365/51
See application file for complete search history.

(56) References Cited

U.S. PATENT DOCUMENTS

| | | | |
|---|---|---|---|
| 7,698,470 | B2 | 4/2010 | Ruckerbauer et al. |
| 7,796,446 | B2 | 9/2010 | Ruckerbauer et al. |
| 7,800,416 | B2 | 9/2010 | Kim et al. |
| 8,799,730 | B2 | 8/2014 | Oh et al. |
| 9,157,960 | B2 | 10/2015 | Bringivijayaraghavan et al. |
| 9,165,624 | B2 | 10/2015 | Byeon |
| 2005/0180206 | A1 | 8/2005 | Randell et al. |
| 2011/0267914 | A1* | 11/2011 | Ishikura ................... G11C 7/06 365/208 |
| 2014/0013183 | A1* | 1/2014 | Sohn ....................... G06F 11/10 714/763 |
| 2016/0062672 | A1 | 3/2016 | Wheeler |

FOREIGN PATENT DOCUMENTS

| | | |
|---|---|---|
| KR | 10-0771544 B1 | 10/2007 |
| KR | 10-0896462 B1 | 5/2009 |
| KR | 10-2010-0030226 A | 3/2010 |
| KR | 10-1027673 B1 | 4/2011 |
| KR | 10-2014-0064461 A | 5/2014 |

* cited by examiner

MEMORY DEVICE INCLUDING ERROR DETECTION CIRCUIT

CROSS-REFERENCE TO RELATED APPLICATION

This application claims priority under 35 U.S.C. § 119 to Korean Patent Application No. 10-2016-0106168, filed on Aug. 22, 2016, in the Korean Intellectual Property Office, the disclosure of which is incorporated herein in its entirety by reference.

BACKGROUND

1. Field

At least some example embodiments of the inventive concepts relate to a memory device and a central processing unit, and more particularly, to a memory device and a central processing unit that each include a line swap circuit and a channel swap circuit to detect error cells.

2. Related Art

A memory capacity of a semiconductor memory device increases according to the development of manufacture process technology. As refining process technology develops, the number of memory cells having an error cell increases. The increase in the memory cells having an error cell decreases a production yield of the semiconductor memory device, and the memory capacity thereof may not be secured. Therefore, methods of detecting and repairing error cells to improve a yield of the semiconductor memory device are needed.

SUMMARY

According to at least e example embodiments of the inventive concepts, a memory device includes a first memory cell array connected to a first internal data line; a second memory cell array connected to a second internal data line; and a line swap circuit configured to connect the first internal data line and the second internal data line with a first external date line and a second external data line based on a driving signal received from the outside, the line swap circuit being configured such that, when the driving signal has a first logic level, the line swap circuit connects the first internal data line and the second internal data line with the first external data line and the second external data line, respectively, and when the driving signal has a second logic level different from the first logic level, the line swap circuit swaps the first external data line and the second external data line so that the first internal data line is connected to the second external data line and the second internal data line is connected to the first external data line.

According to at least e example embodiments of the inventive concepts, a central processing unit included a first chip configured to perform a processing function; a second chip that is connected to the first chip; and a test unit configured to determine whether data output from the second chip includes an error, wherein the second chip includes a first memory layer connected to a first internal channel, a second memory layer connected to a second internal channel, and a memory buffer configured to output data received from the first and second internal channels outside of the central processing unit through first and second external channels, respectively, and wherein, the memory buffer includes a channel exchange circuit configured to connects the first internal channel and the second internal channel with the first external channel and the second external channel based on a driving signal received from the outside, and the channel exchange circuit is configured to, connect the first internal channel and the second internal channel to the first external channel and the second external channel, respectively, when the driving signal has a first logic level, and swap the first external channel and the second external channel so that the first internal channel is connected to the second external channel and the second internal channel is connected to the first external channel, when the driving signal has a second logic level that is different from the first logic level.

According to at least e example embodiments of the inventive concepts, a memory device includes a first memory cell array connected to a first internal data line; a second memory cell array connected to a second internal data line; and a line swap circuit configured to receive a driving signal, connect the first and second internal data lines to first and second external data lines, respectively, based on the driving signal, and swap the connections of the first and second internal data lines such that the first and second internal data lines are connected to the second and first external data lines, respectively, based on the driving signal.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
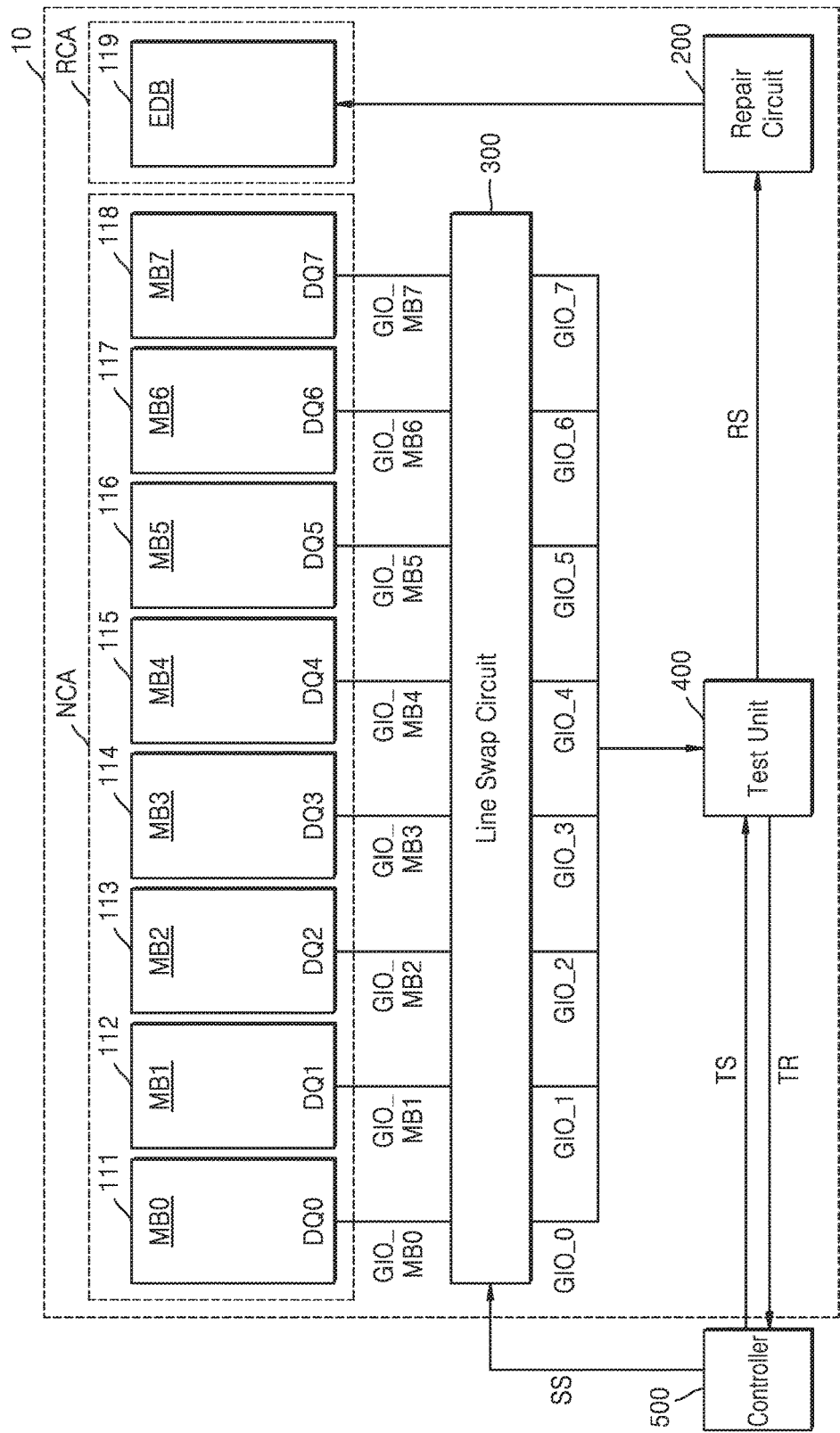
FIG. 1 is a block diagram of an example of a memory device according to at least one example embodiment of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram of a first example of a memory device 10 according to at least one example embodiment of the inventive concepts.

Referring to FIG. 1, the memory device 10 according to at least one example embodiment of the inventive concepts may include a normal cell array NCA and a redundancy cell array RCA. Further, the memory device 10 may further include a line swap circuit 300 and a repair circuit 200.

The normal cell array NCA may include first to eighth memory cell blocks 111-118, and the redundancy cell array RCA may include at least one redundancy repair memory cell block 119. According to at least some example embodiments of the inventive concepts, a memory capacity of the memory device 10 is determined by sizes of the first to eighth memory cell blocks 111-118 included in the normal cell array NCA. According to at least some example embodiments of the inventive concepts, the memory cell block 119 included in the redundancy cell array RCA is a memory cell block for redundancy repair. The redundancy repair memory cell block 119 may be a memory cell block for data block repair which may include repairing error cells that occur in the first to eighth memory cell blocks 111-118.

FIG. 1 illustrates only one memory bank of the memory device 10. Further, as is illustrated in FIG. 1, the normal cell array NCA and the redundancy cell array RCA may be included in the same memory bank.

The error cells may include defective memory cells and weak cells. The defective memory cells denote cells having hardware defects or cells that stopped operating due to defects caused by the manufacturing process, for example, memory cells having disconnections or shorts that occurred on the wire. The weak cells denote cells having software defects, memory cells that have defects under a particular voltage condition, or memory cells that have defects under particular operation timing. The weak cells may include cells experiencing deterioration in various device characteristics, for example, cells having a refresh period that is below a reference amount of time, or cells that exhibit deterioration in cell writing characteristics or variable retention periods.

The first to eighth memory cell blocks 111-118 include first to eighth pluralities of memory cells, respectively. Each of the first to eighth pluralities of memory cells may be arranged as columns and rows of a memory cell array. Further, the redundancy repair memory cell block 119 also includes a plurality of memory cells that may be arranged as columns and rows of a memory cell array. In the example shown in FIG. 1, memory cells included the same row, among rows of the first to eighth memory cell blocks 111-118, may be connected to the same bit line. Memory cells connected to intersections of a word line and the bit line may be dynamic memory cells or resistive memory cells.

In the memory device 10, the bit lines that correspond to a burst length may be simultaneously accessed to support the burst that represents a desired number of column locations where bit lines may be accessed or, alternatively, the maximum number of column locations where bit lines may be accessed. First to eighth internal data lines GIO_MB0-GIO_MB7 and first to eighth external data lines GIO_0-GIO_7 may each have the number of lines that corresponds to the burst length. Therefore, the semiconductor memory device 10 of FIG. 1 may have, for example, a burst length that is set to 1.

The line swap circuit 300 may connect the first to eighth internal data lines GIO_MB0-GIO_MB7 to the first to eighth external data lines GIO_0-GIO_7 based on a driving signal SS received from the outside. When the driving signal SS has a first logic level, the line swap circuit 300 connects the first to eighth internal data lines GIO_MB0-GIO_MB7 to the first to eighth external data lines GIO_0-GIO_7, respectively. When the driving signal SS has a second logic level, the second logic level being different from the first logic level, the line swap circuit 300 may swap the first to eighth external data lines GIO_0-GIO_7. Example implementations of the line swap circuit 300, according to at least some example embodiments of the inventive concepts, will be discussed in greater detail below with reference to FIGS. 2A and 2B.

The memory device 10 may further include a test unit 400, as shown in FIG. 1. The test unit 400 may be connected to the line swap circuit 300 via the first to eighth external data lines GIO_0-GIO_7. When a test mode is on, a controller 500 applies a test signal TS to the test unit 400. According to at least some example embodiments of the inventive concepts, first to eighth data units DQ0-DQ7 stored in the first to eighth memory cell blocks 111-118 are transmitted to the test unit 400 via the first to eighth internal data lines GIO_MB0-GIO_MB7, the line swap circuit 300, and the first to eighth external data lines GIO_0-GIO_7. According to at least some example embodiments of the inventive concepts, the test unit 400 determines whether each of the first to eight data units DQ0-DQ7 have errors or not. However, at least some example embodiments of the inventive concepts are not limited to the example structure shown in FIG. 1, the memory device 10 may not include a test unit 400, and the test unit 400 may detect an error that occurred on data output through the first to eighth external data lines GIO_0-GIO_7 from the outside of the memory device 10. According to at least some example embodiments of the inventive concepts, the test unit 400 may be implemented by a circuit or circuitry (i.e., hardware). The test unit 400 may also be referred to, herein, as the test device 400. According to the results of the test, when an additional test is needed, the test unit 400 may transmit a test result signal TR to the controller 500. The controller 500 may operate the line swap circuit 300 in response to the test result signal TR transmitted from the test unit 400 so that an additional test may be performed. Detailed description of the test unit 400 will be further provided in the description of FIG. 3.

The controller 500 stores data for controlling various operation modes of the memory device 10. According to at least one example embodiment of the inventive concepts, the controller 500 may store data for controlling a test mode. When the test mode is on, the controller 500 may transmit driving signals TS and SS for operating the test unit 400 and the line swap circuit 300, respectively. Also, the controller 500 may receive the results of the test performed by the test unit 400.

As a result of determining whether the data written in the first to eighth memory cell blocks 111-118 has errors or not by the test performed by the test unit 400, when the first to eighth memory cell blocks 111-118 include error cells having an error are included in the first to eighth memory cell blocks 111-118, the test unit 400 may transmit a repair signal RS to a repair circuit 200. In response to the repair signal RS, the repair circuit 200 may write data to the redundancy repair memory cell block 119 instead of an error cell block. According to at least some example embodiments of the inventive concepts, the test unit 400 may generate the repair signal RS such that the repair signal RS includes information indicating an identity of the error cell block. The repair circuit 200 may determine which memory cell block to replace with the redundancy repair memory block 119, based on the identity of the error cell block indicated by the repair signal RS.

In FIG. 1, the total number of memory cell blocks is 8, and only one bit line is shown in each of the memory cell blocks, however, at least some example embodiments of the inventive concepts are not limited thereto. A memory cell block may include a plurality of bit lines. This will be further described in detail with reference to FIG. 6.

Figure 2A:
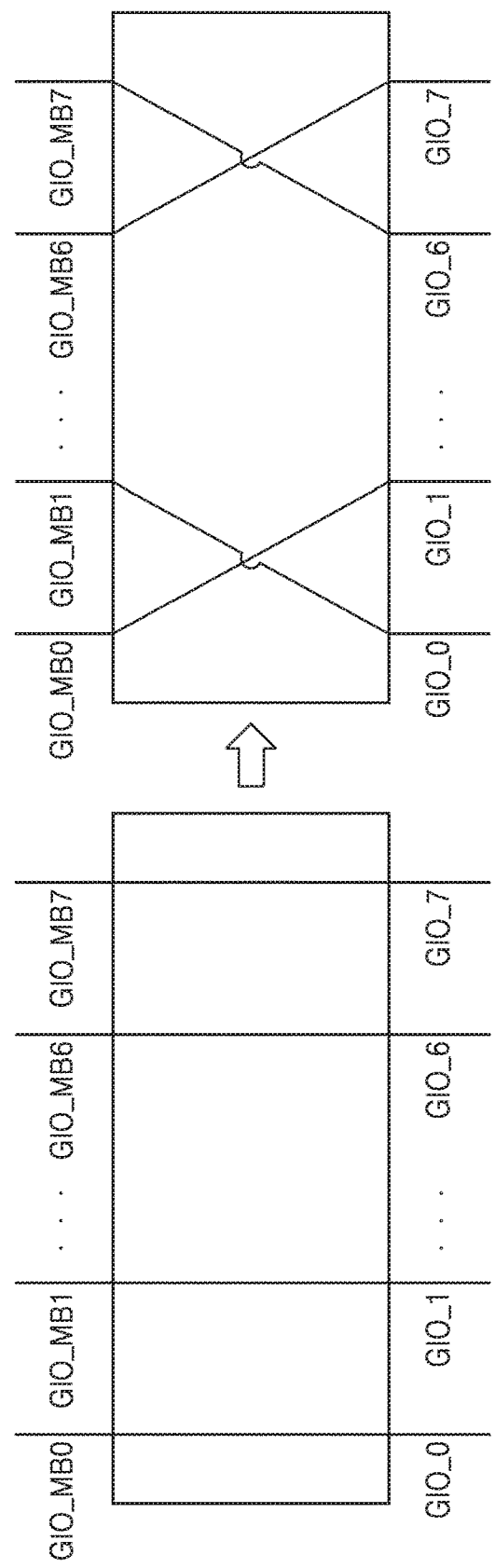
FIG. 2A is a view that illustrates a line swap circuit that is included in the memory device according to at least one example embodiment of the inventive concepts.

FIG. 2A is a view that illustrates a line swap circuit 300 that is included in the memory device 10 according to at least one example embodiment of the inventive concepts.

Referring to FIGS. 1 and 2A, the line swap circuit 300 of the memory device 10 according to at least one example embodiment of the inventive concepts may connect the first internal data lines GIO_MB0-GIO_MB7 to the first external data lines GIO_0-GIO_7. When a driving signal SS having a first logic level is received from the controller 500 to the line swap circuit 300, the line swap circuit 300 may connect the internal data lines GIO_MB0-GIO_MB7 to the external data lines GIO_0-GIO_7, respectively. Accordingly, data units DQ0-DQ7 that have been written in the first to eighth memory cell blocks 111-118 may be transmitted to the first to eighth external data lines GIO_0-GIO_7, respectively, and thus error cells may be detected. A size of each of data units DQ0-DQ7 may be, for example, a page of data, or a size of data set in accordance with preferences of a user or designer of the memory device 10. When a driving signal SS having a second logic level is transmitted from the controller 500, the line swap circuit 300 may swap connection between the internal data lines GIO_MB0-GIO_MB7 and the external data lines GIO_0-GIO_7 in response to the driving signal SS. In one embodiment, the line swap circuit 300 may connect the first internal data line GIO_MB0 to the second external data line GIO_1 and connect the second internal data line GIO_MB1 to the first external data line GIO_0.

That is, the adjacent internal data lines may swap the external data lines to which the adjacent internal data lines are connected. In this case, the data unit DQ0 written in the first memory cell block 111 is detected by the second external data line GIO_1, and the data unit DQ1 written in the second memory cell block 112 may be detected by the first external data line GIO_0. However, according to at least some example embodiments of the inventive concepts, ¥ the internal data lines that are not adjacent to each other may swap the external data lines connected to the internal data lines, respectively. For example, according to at least some example embodiments of the inventive concepts, all connections between the internal data lines GIO_MB0-GIO_MB7 and the external data lines GIO_0-GIO_7 may be swapped. Additionally or alternatively, according to at least some example embodiments of the inventive concepts, only connections of the internal data lines and the external data lines connected to the memory cell blocks that are determined to include error cells may be swapped.

Figure 2B:
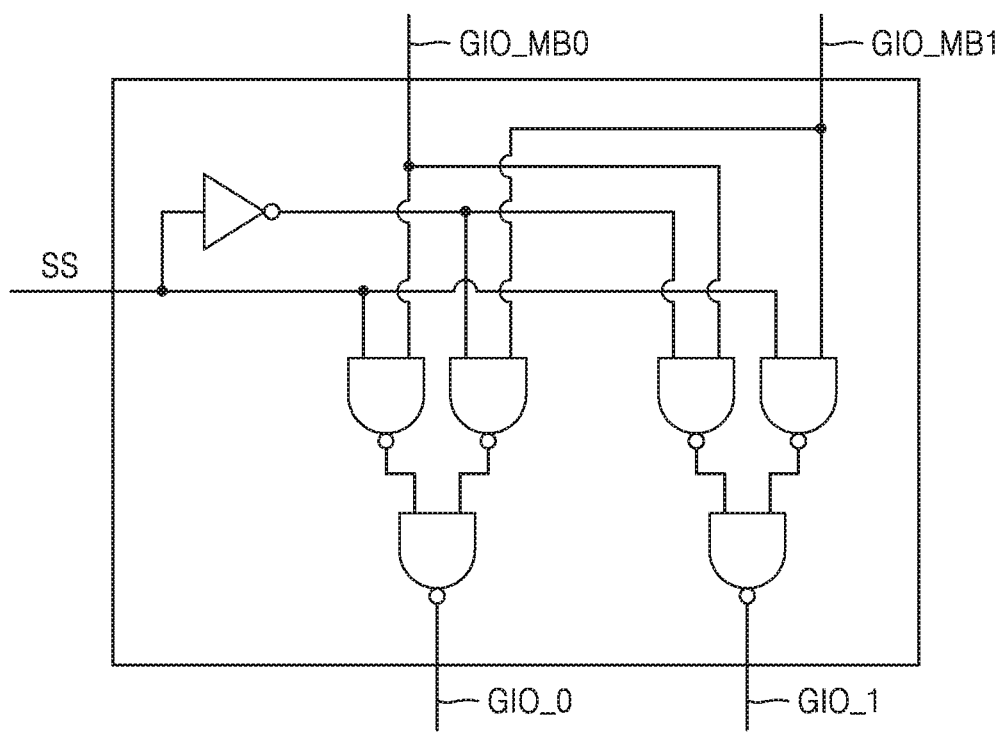
FIG. 2B is a circuit diagram illustrating an example implementation of a portion of the line swap circuit 300 in the memory device 10, according to at least one example embodiment of the inventive concepts.

FIG. 2B is a circuit diagram illustrating an example implementation of a portion of the line swap circuit 300 in the memory device 10, according to at least one example embodiment of the inventive concepts.

Referring to FIGS. 1 and 2B, the line swap circuit 300 may be configured to include, for example, a plurality of NAND gates. However, at least some example embodiments of the inventive concepts are not limited to the example structure shown in FIG. 2B, and line swap circuit may be implemented using logical elements in place of, or in addition to, the NAND gates illustrated in FIG. 2B.

According to the driving signal SS transmitted from the controller 500 to the line swap circuit 300, the first external data line GIO_0 and the second external data line through which the first and second data units DQ0 and DQ1 are output, may be changed, wherein the first and second data units DQ0 and DQ1 are input through the first internal data line GIO_MB0 and the second internal data line GIO_MB1 connected to the line swap circuit 300.

TABLE 1

| SS | First external data line (GIO_0) | Second external data line (GIO_1) |
|---|---|---|
| L | DQ1 | DQ0 |
| H | DQ0 | DQ1 |

As shown in Table 1, when the driving signal SS transmitted from the controller 500 has a first logic level L, the first data unit DQ0 may be output through the first external data line GIO_0 and the second data unit DQ1 through the second external data line GIO_1. When the driving signal SS transmitted from the controller 500 has a second logic level H, the second data unit DQ1 may be output through the first external data line GIO_0 and the first data unit DQ0 through the second external data line GIO_1. The first logic level L may have a value lower than that of the second logic level H, However, at least some example embodiments of the inventive concepts are not limited thereto.

FIG. 2B illustrates an example a logic circuit that corresponds to a portion of the line swap circuit 300 including connections between a pair of internal data lines (i.e., GIO_MB0 and GIO_MB1) and a corresponding pair of external data lines (i.e., GIO_0 and GIO_1). However, according to at least some example embodiments of the inventive concepts, the line swap circuit 300 may include a circuit like that shown in FIG. 2B for connections between each pair of internal data lines, among the first to eighth internal data lines GIO_MB0-GIO_MB7, and each corresponding pair of external data lines, among the first to eighth external data lines GIO_0-GIO_7. For example, with respect to the example structure shown in FIG. 1 in which there are eight external data lines and eight internal data lines, the line swap circuit 300 may include four circuits having the structure illustrated in FIG. 2B. When the same driving signal SS is applied to all the logic circuits, all connections of the first to eighth external data lines GIO_0-GIO_7 may be swapped at the same time. On the other hand, the driving signal SS may be individually applied to each of the logic circuits, and in this case, connections between the first to eighth internal data lines GIO_MB0-GIO_MB7 and the first to eighth external data lines GIO_0-GIO_7 may be partially swapped.

Figure 3:
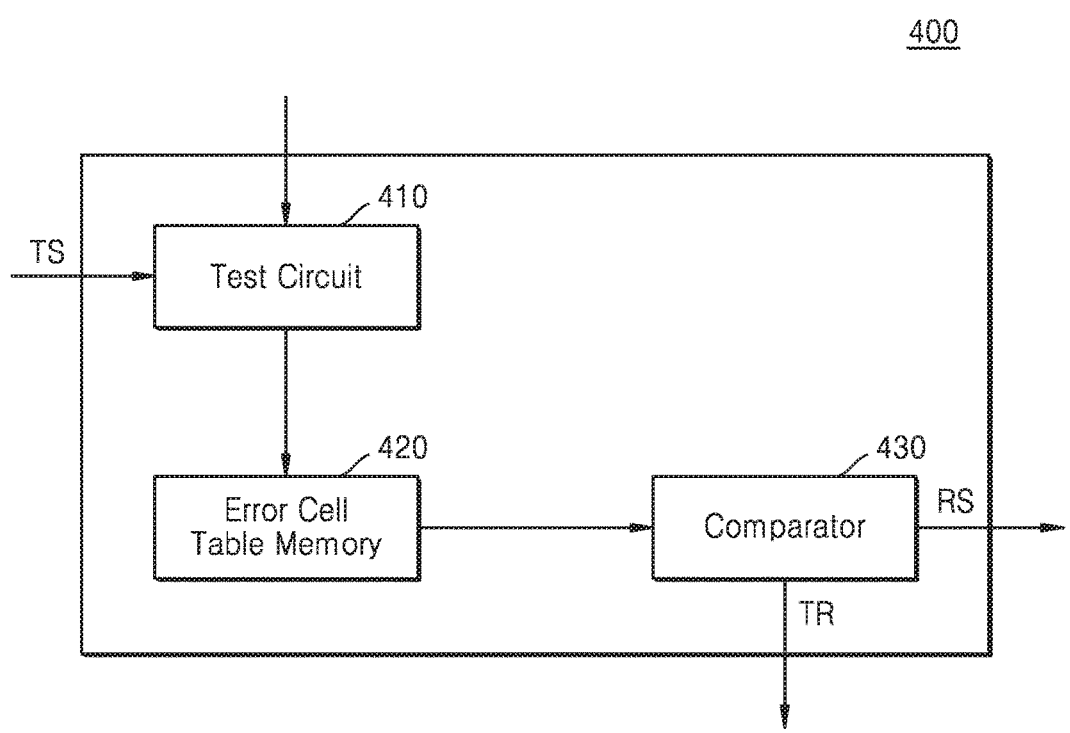
FIG. 3 is a block diagram that illustrates a test unit according to at least one example embodiment of the inventive concepts.
Figure 4:
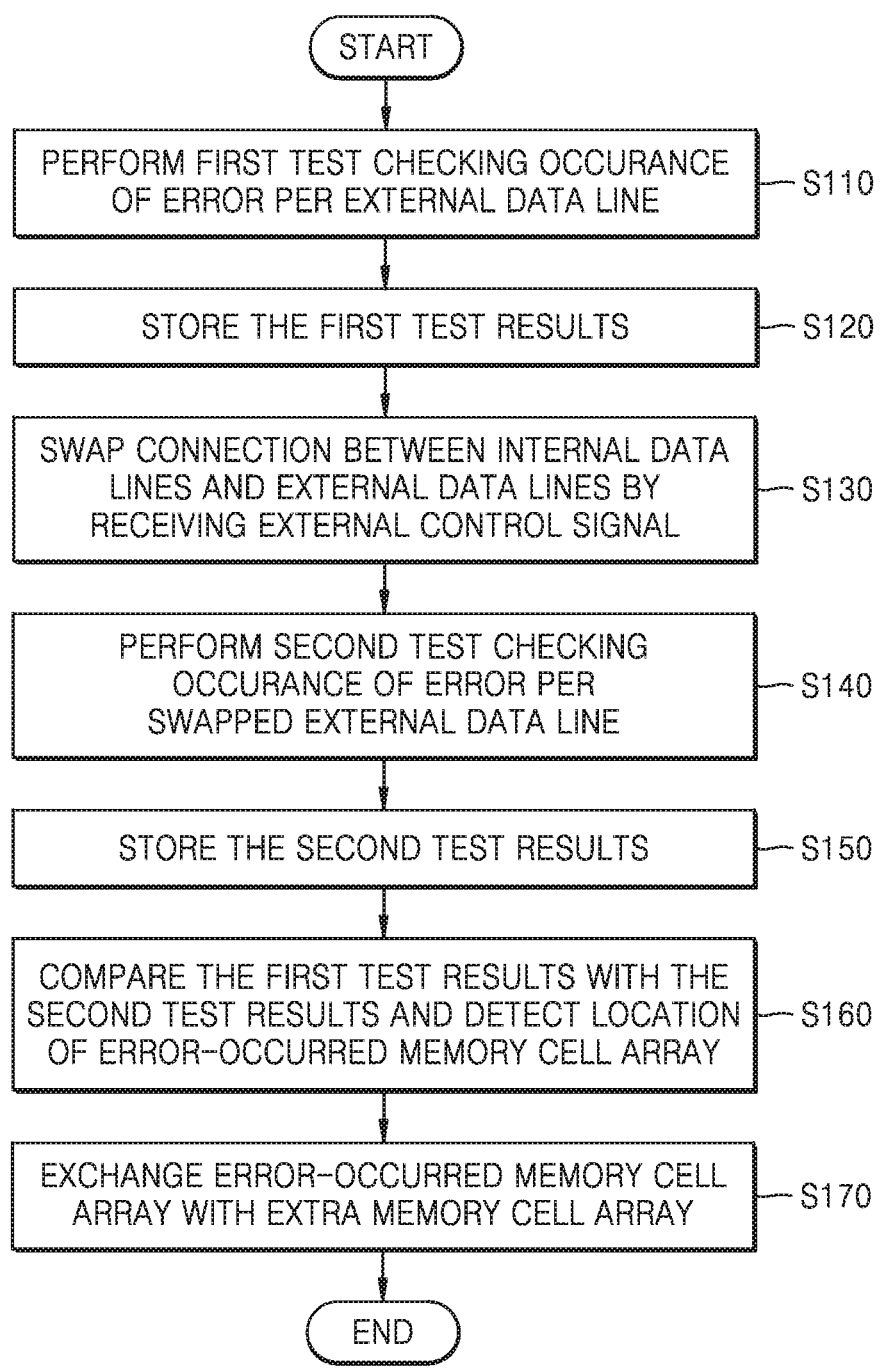
FIG. 4 is a flowchart that illustrates a method of operating a memory device according to at least some example embodiments of the inventive concepts.

FIG. 3 is a block diagram that illustrates a test unit 400 according to at least one example embodiment of the inventive concepts. FIG. 4 is a flowchart that illustrates a method of operating a memory device according to at least some example embodiments of the inventive concepts.

Referring to FIGS. 1, 3, and 4, the test unit 400 according to at least one example embodiment of the inventive concepts may include a test circuit 410, an error cell table memory 420, and a comparator 430.

When the test signal TS is transmitted from the controller 500, the test circuit 410 may determine whether an error has occurred in data written to the first to eighth memory cell blocks 111-118 based on each of the first to eighth data units DQ0-DQ7 transmitted from the first to eighth external data lines GIO_0-GIO_7. For example, a method of sensing error occurrence in the data may include repeatedly writing particular data to the plurality of memory cells and repeatedly comparing the read result with the particular data. The test circuit 410 may determine an error cell and a normal cell based on the comparison result.

Referring to FIG. 4, when the driving signal SS having a first logic level is transmitted to the line swap circuit 300 from the controller 500, in operation S110, the test circuit 410 may perform a first test that determines whether an error has occurred in the first to eighth data units DQ0-DQ7 transferred from each of the first to eighth external data lines GIO_0-GIO_7. In operation S120, the test circuit 410 may transmit the results of the first test to the error cell table memory 420, and the error cell table memory 420 may store the results of the first test in a table.

After the first test, in operation S130, the controller 500 may transmit a driving signal SS having a second logic level to the line swap circuit 300. The line swap circuit 300 may swap connection between the first to eighth internal data lines GIO_MB0-GIO_MB7 and the first to eighth external data lines GIO_0-GIO_7 in response to the driving signal SS.

In operation S140, the test circuit 410 may perform a second test that determines whether an error has occurred in the first to eighth data units DQ0-DQ7 transmitted from each of the swapped first to eighth external data lines GIO_0-GIO_7. In operation S150, the test circuit 410 after undergoing the second test may transmit the results of the second test to the error cell table memory 420, and the error cell table memory 420 may store the results of the second test in a table.

After the test circuit 410 performs both the first test and the second test, the error cell table memory 420 may transmit the stored results of the first test and the second test to the comparator 430 and the memory device 10 may proceed to operation S160. In operation S160, the comparator 430 may compare the results of the first test with the results of the second test received from the error cell table memory 420.

TABLE 2

| SS | First external data line (GIO_0) | Second external data line (GIO_1) |
|---|---|---|
| Results of first test | ○ | X |
| First example results of second test | X | ○ |
| Second example results of second test | ○ | X |

In Table 2, X denotes error occurrence in data transmitted from an external data line, and O denotes no error occurrence. As shown in Table 2, for example, it is assumed that an error was detected with respect to the second data unit DQ1 transmitted to the second external data line GIO_1 in the results of the first test. Table 2 shows two different example results of the second test, each of which is discussed below.

In first example results of the second test, an error may be detected from data transmitted to the first external data line GIO_0 that swapped connection with the second external data line GIO_1. That is, the error detected from the second external data line GIO_1 of the first test and the error detected from the first external data line GIO_0 of the second test may be identical to each other. In this case, since it is deemed that the error occurred with respect to the second data unit DQ1, the second memory cell block 112, to which the second data unit DQ1 has been written, may be determined to have included an error cell.

On the other hand, in second example results of the second test, an error may be detected as it is from data transmitted to the second external data line GIO_1. That is, an error that has been monitored in the first external data line GIO_0 of the second test may not be detected. Also, results different from the error that has been detected in the second external data line GIO_1 of the first test may be derived. In this case, the first and second memory cell blocks 111 and 112 are determined to not include an error cell, and the error may be determined to be from an element of the memory device 10 other than the first and second memory cell blocks 111 and 112.

Thus, in operation S160, the memory device 10 may detect a location of a memory cell block including an error cell by comparing the results of the first test with the results of the second test. When the second memory cell block 112 is determined to be including the error cell as well as the first results of the second test shown in Table 2 as a result of comparing the results of the first test with the results of the second test, the comparator 430 may provide the repair signal RS to the repair circuit 200. In operation S170, the repair circuit 200 may substitute the redundancy repair memory cell block 119 for the second memory cell block 112. According to at least some example embodiments of the inventive concepts, the test unit 400 may generate the repair signal RS such that the repair signal RS includes information indicating an identity of the second memory cell block 112. The repair circuit 200 may substitute the redundancy repair memory cell block 119 for the second memory cell block 112, based on the identity of the second memory cell block 112 indicated by the repair signal RS.

Figure 5:
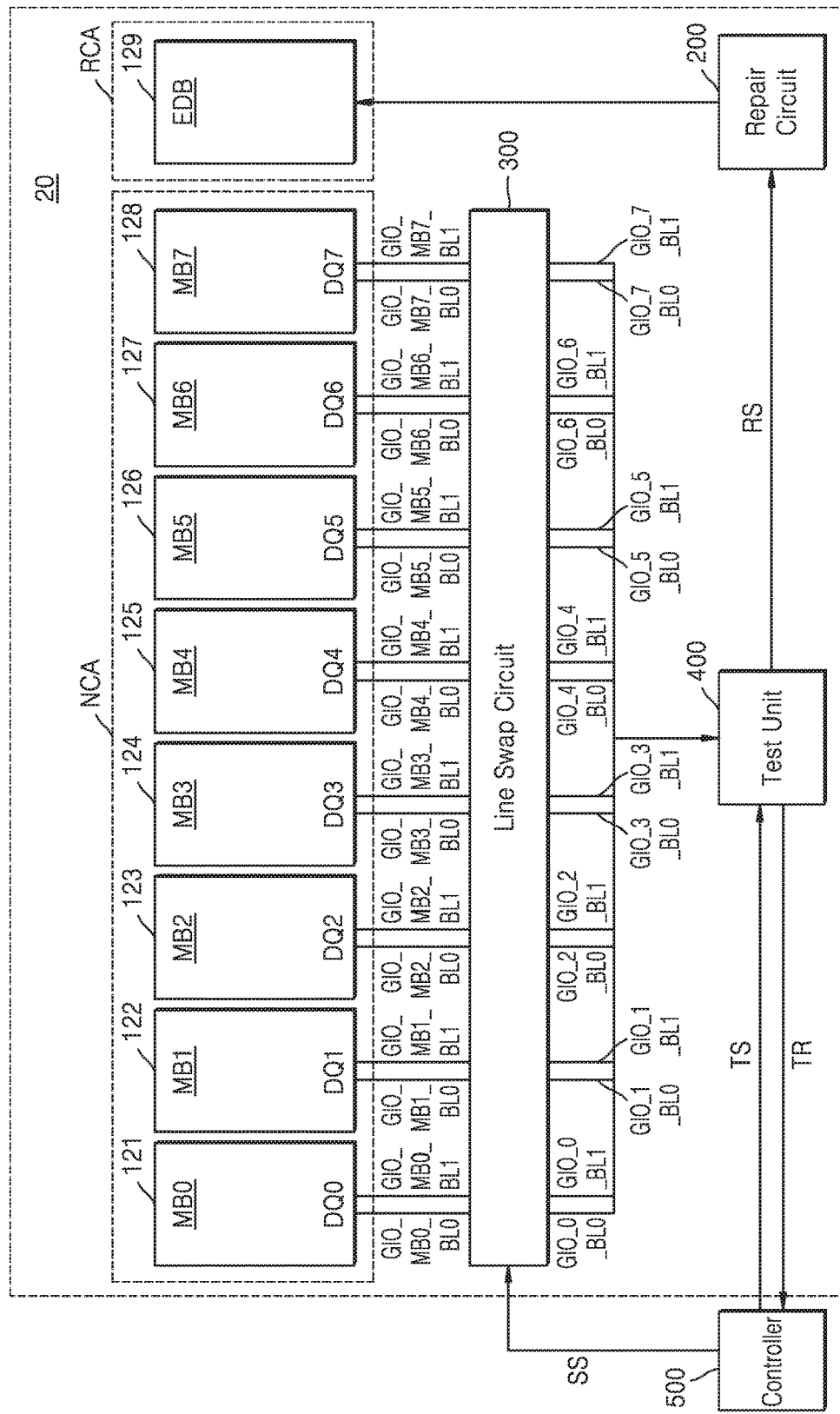
FIG. 5 is a block diagram of a second example of the memory device according to at least some example embodiments of the inventive concepts.

FIG. 5 is a block diagram of a second example that illustrates a memory device 20 according to at least some example embodiments of the inventive concepts. Like reference numerals in FIG. 5 denote like elements in FIG. 2, and thus repeated explanations thereof are omitted for convenience of description.

Referring to FIG. 5, the memory device 20 may include a normal cell array NCA and a redundancy cell array RCA. Also, the memory device 20 may include a line swap circuit 300 and a repair circuit 200.

The normal cell array NCA may include first to eighth memory cell blocks 121-128, and the redundancy cell array RCA may include at least one redundancy repair memory cell block 129. The redundancy repair memory cell block 129 may be a memory cell block for data block repair, which may include repairing error cells occurred in the first to eighth memory cell blocks 121-128.

Each of the first to eighth memory cell blocks 121-128 and the redundancy repair memory cell block 129 includes a plurality of memory cells which may be arranged as columns and rows of a memory cell array, for example, in the same manner discussed above with respect to first to eighth memory cell blocks 111-118 and the redundancy repair memory cell block 119. According to at least one example embodiment of the inventive concepts, rows of the first to eighth memory cell blocks 121-128 may be constituted of two bit lines. Memory cells connected to intersections of word lines and the bit lines may be dynamic memory cells or resistive memory cells.

In the memory device 20, the bit lines that correspond to a burst length may be simultaneously accessed to support the burst length that represents a desired number of column locations capable of accessing the bit lines or, alternatively, the maximum number of column locations capable of accessing the bit lines. Internal data lines GIO_MB0_BL0, GIO_MB0_BL1, GIO_MB1_BL0, GIO_MB1_BL1, GIO_MB2_BL0, GIO_MB2_BL1, GIO_MB3_BL0, GIO_MB3_BL1, GIO_MB4_BL0, GIO_MB4_BL1, GIO_MB5_BL0, GIO_MB5_BL1, GIO_MB6_BL0, GIO_MB6_BL1, GIO_MB7_BL0, and GIO_MB7_BL1 and external data lines GIO_0_BL0, GIO_0_BL1, GIO_1_BL0, GIO_1_BL1, GIO_2_BL0, GIO_2_BL1, GIO_MB3_BL0, GIO_3_BL1, GIO_4_BL0, GIO_4_BL1, GIO_5_BL0, GIO_5_BL1, GIO_6_BL0, GIO_6_BL1, GIO_7_BL0, and GIO_7_BL1 may each be in a number that corresponds to the burst length. Therefore, the memory device 20 of FIG. 5 may have, for example, a burst length that is set to 2.

The line swap circuit 300 may connect first to eighth internal data lines GIO_MB0_BL0, GIO_MB0_BL1, GIO_MB1_BL0, GIO_MB1_BL1, GIO_MB2_BL0, GIO_MB2_B1, GIO_MB3_BL0, GIO_MB3_BL1, GIO_MB4_BL0, GIO_MB4_BL1, GIO_MB5_BL0, GIO_MB5_BL1, GIO_MB6_BL0, GIO_MB6_BL1, GIO_MB7_BL0, and GIO_MB7_BL1 to first to eighth external data lines GIO_0_BL0, GIO_0_BL1, GIO_1_BL0, GIO_1_BL1, GIO_2_BL0, GIO_2_BL1, GIO_MB3_BL0, GIO_3_BL1, GIO_4_BL0, GIO_4_BL1, GIO_5_BL0, GIO_5_BL1, GIO_6_BL0, GIO_6_BL1, GIO_7_BL0, and GIO_7_BL1. Detailed description of the line swap circuit 300 will be further provided in the description of FIG. 6.

As shown in FIG. 5, the memory device 20 may further include a test unit 400, however, at least some example embodiments of the inventive concepts are not limited thereto. The memory device 20 may not include a test unit 400, and the test unit 400 may detect errors occurred in data that is output through the external data lines GIO_0_BL0, GIO_0_BL1, GIO_1_BL0, GIO_1_BL1, GIO_2_BL0, GIO_2_BL1, GIO_MB3_BL0, GIO_3_BL1, GIO_4_BL0, GIO_4_BL1, GIO_5_BL0, GIO_5_BL1, GIO_6_BL0, GIO_6_BL1, GIO_7_BL0, and GIO_7_BL1 from the outside of the memory device 20.

The test unit 400 may be connected to the line swap circuit 300 via the external data lines GIO_0_BL0, GIO_0_BL1, GIO_1_BL0, GIO_1_BL1, GIO_2_BL0, GIO_2_BL1, GIO_MB3_BL0, GIO_3_BL1, GIO_4_BL0, GIO_4_BL1, GIO_5_BL0, GIO_5_BL1, GIO_6_BL0, GIO_6_BL1, GIO_7_BL0, and GIO_7_BL1. When a test mode is on, a controller 500 applies a test signal TS to the test unit 400, and thus the test unit 400 may determine whether data written in first to eighth memory cell blocks 121-128 has defects or not based on each of first to eighth data units DQ0-DQ7 that are transmitted from the external data lines GIO_0_BL0, GIO_0_BL1, GIO_1_BL0, GIO_1_BL1, GIO_2_BL0, GIO_2_BL1, GIO_MB3_BL0, GIO_3_BL1, GIO_4_BL0, GIO_4_BL1, GIO_5_BL0, GIO_5_BL1, GIO_6_BL0, GIO_6_BL1, GIO_7_BL0, and GIO_7_BL1. According to the results of the test, when an additional test is needed, the test unit 400 may transmit a test result signal TR to the controller 500. The controller 500 may operate the line swap circuit 300 in response to the test result signal TR transmitted from the test unit 400 so that an additional test may be performed.

The controller 500 may transmit driving signals TS and SS for operating the test unit 400 and the line swap circuit 300, respectively. Also, the controller 500 may receive the results of the test performed by the test unit 400.

As a result of determining whether the data written in the first to eighth cell memory blocks 121-128 have defects or not by the test performed by the test unit 400, when the first to eighth cell memory blocks 121-128 include error cells having an error, the test unit 400 may transmit a repair signal RS to the repair circuit 200. In response to the repair signal RS, the repair circuit 200 may write data to the redundancy repair memory cell block 129 instead of an error cell block. According to at least some example embodiments of the inventive concepts, the test unit 400 may generate the repair signal RS such that the repair signal RS includes information indicating an identity of the second memory cell block 112. The repair circuit 200 may substitute the redundancy repair memory cell block 129 for the second memory cell block 112, based on the identity of the second memory cell block 112 indicated by the repair signal RS.

Burst lengths of the memory device 10 of FIG. 1 and the memory device 20 of FIG. 5 are 1 and 2, respectively, however, at least some example embodiments of the inventive concepts are not limited thereto. The burst length may be greater than 2, and at least some example embodiments of the inventive concepts may be applied.

Figure 6:
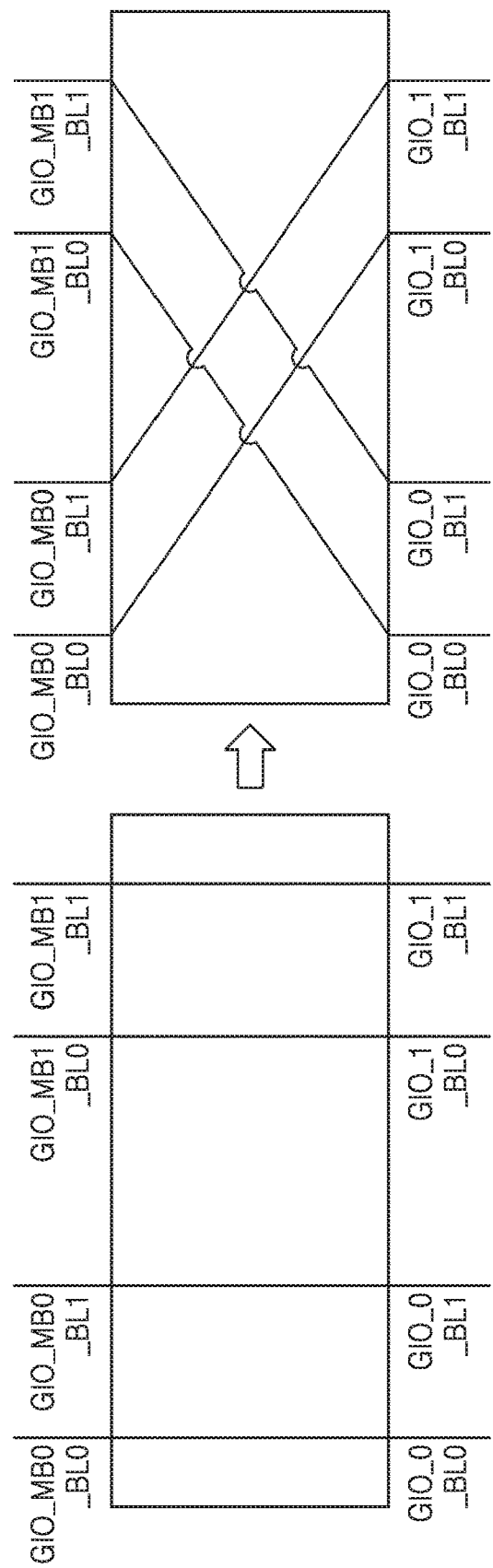
FIG. 6 is a view that illustrates one part of the line swap circuit included in the memory device according to at least one example embodiment of the inventive concepts.

FIG. 6 is a view that illustrates one part of the line swap circuit 300 included in the memory device 20 according to at least one example embodiment of the inventive concepts.

Referring to FIGS. 5 and 6, when a driving signal SS having a first logic level is transmitted from the controller 500, the line swap circuit 300 may connect the internal data lines GIO_MB0_BL0, GIO_MB0_BL1, GIO_MB1_BL0, GIO_MB1_BL1, GIO_MB20_BL0, GIO_MB2_BL1, GIO_MB3_BL0, GIO_MB3_BL1, GIO_MB4_BL0, GIO_MB4_BL1, GIO_MB5_BL0, GIO_MB5_BL1, GIO_MB6_BL0, GIO_MB6_BL1, GIO_MB7_BL0, and GIO_MB7_BL1 to the external data lines GIO_0_BL0, GIO_0_BL1, GIO_1_BL0, GIO_1_BL1, GIO_2_BL0, GIO_2_BL1, GIO_MB3_BL0, GIO_3_BL1, GIO_4_BL0, GIO_4_BL1, GIO_5_BL0, GIO_5_BL1, GIO_6_BL0, GIO_6_BL1, GIO_7_BL0, and GIO_7_BL1, respectively. Accordingly, data units DQ0-DQ7 that have been written in the first to eighth memory cell blocks 121-128 may be transmitted to the first to eighth external data lines GIO_0_BL0, GIO_0_BL1, GIO_1_BL0, GIO_1_BL1, GIO_2_BL0, GIO_2_BL1, GIO_MB3_BL0, GIO_3_BL1, GIO_4_BL0, GIO_4_BL1, GIO_5_BL0, GIO_5_BL1, GIO_6_BL0, GIO_6_BL1, GIO_7_BL0, and GIO_7_BL1, respectively, and thus error cells may be detected.

When a driving signal SS having a second logic level, which is different from the first logic level, is transmitted from the controller 500, the line swap circuit 300 may swap connection between the internal data lines GIO_MB0_BL0, GIO_MB0_BL1, GIO_MB1_BL0, GIO_MB1_BL1, GIO_MB20_BL0, GIO_MB2_BL1, GIO_MB3_BL0, GIO_MB3_BL1, GIO_MB4_BL0, GIO_MB4_BL1, GIO_MB5_BL0, GIO_MB5_BL1, GIO_MB6_BL0, GIO_MB6_BL1, GIO_MB7_BL0, and GIO_MB7_BL1 and the external data lines GIO_0_BL0, GIO_0_BL1, GIO_1_BL0, GIO_1_BL1, GIO_2_BL0, GIO_2_BL1, GIO_MB3_BL0, GIO_3_BL1, GIO_4_BL0, GIO_4_BL1, GIO_5_BL0, GIO_5_BL1, GIO_6_BL0, GIO_6_BL1, GIO_7_BL0, and GIO_7_BL1 in response to the driving signal SS.

In one embodiment, the line swap circuit 300 may connect the first internal data lines GIO_MB0_BL0 and GIO_MB0_BL1 transmitting data unit DQ0 of the first memory cell block 121 to the second external data lines GIO_1_BL0 and GIO_1_BL1 and connect the second internal data lines GIO_MB1_BL0 and GIO_MB1_BL1 transmitting data unit DQ1 of the second memory cell block 122 to the first external data lines GIO_0_BL0 and GIO_0_BL1. In this case, the data unit DQ0 written in the first memory cell block 121 is detected by the second external data lines GIO_1_BL0 and GIO_1_BL1, and the data unit DQ1 written in the second memory cell block 122 may be detected by the first external data line GIO_0_BL0 and GIO_0_BL1. However, in some embodiments, and the internal data lines transmitting data of a memory cell block that is not adjacent to the internal data lines may swap the external data lines connected to the internal data lines, respectively.

FIGS. 1 to 6 illustrate swapping connections between the external data lines in the same memory bank, however, at least some example embodiments of the inventive concepts are not limited thereto, and external data lines included in different memory banks may be swapped. A location of a memory bank including an error cell may be detected by swapping data lines between different memory banks.

Figure 7A:
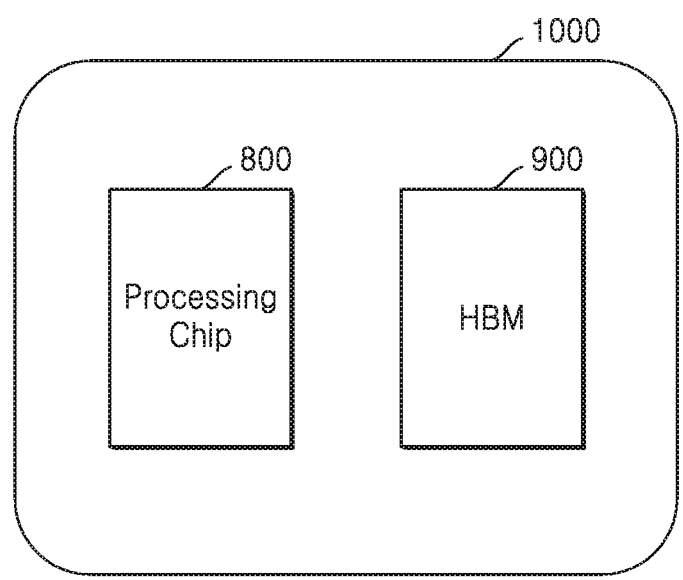
FIG. 7A is a block diagram that illustrates a central processing unit according to at least some example embodiments of the inventive concepts.
Figure 7B:
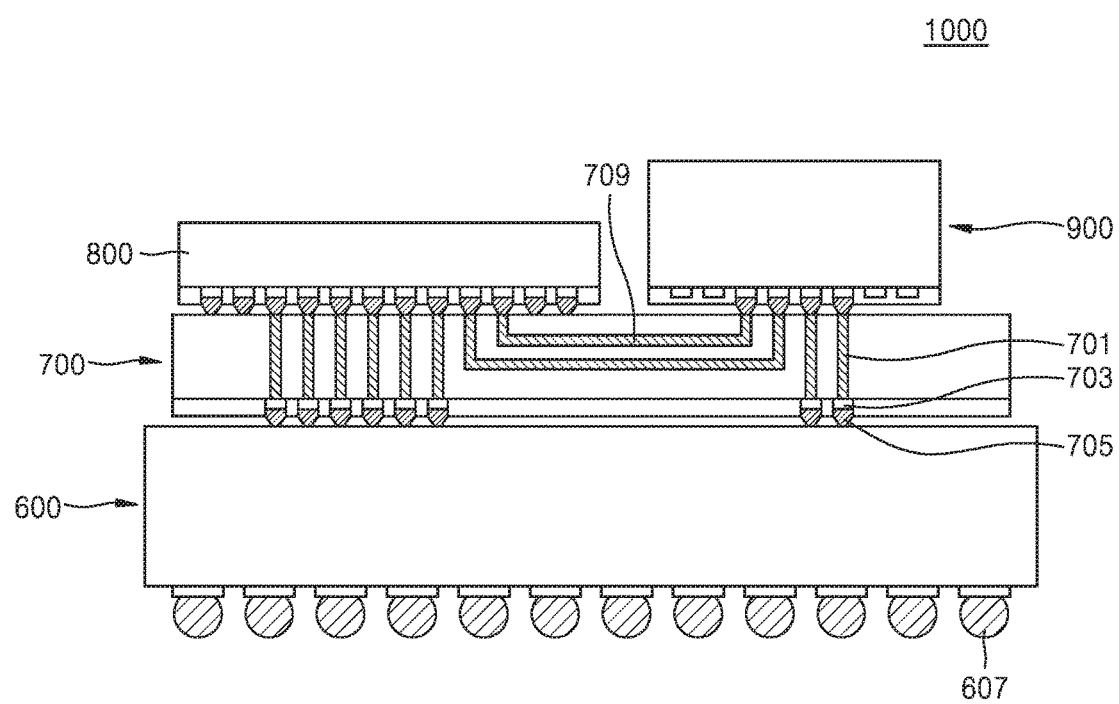
FIG. 7B illustrates cross-sectional view of the central processing unit of FIG. 7A according to at least some example embodiments of the inventive concepts.

FIG. 7A is a block diagram that illustrates a central processing unit 1000 according to at least some example embodiments of the inventive concepts. FIG. 7B is a view that illustrates the central processing unit 1000 according to at least some example embodiments of the inventive concepts.

Referring to FIGS. 7A and 7B, the central processing unit 1000 according to at least some example embodiments of the inventive concepts may include a first chip 800 that performs a processing function; and a second chip 900 that is connected to the first chip 800 and supports the processing function.

In particular, the central processing unit 1000 may include an interposer substrate 700 that is stacked on a logic semiconductor package 600, the first chip 800 that is mounted on the interposer substrate 700 and the second chip 900 that includes a plurality of chips stacked on the interposer substrate 700. The first chip 800 may be electrically connected by wires 709 formed in the second chip 900 and the interposer substrate 700. Here, the stacked plurality of chips may be memory chips (e.g., DRAM). Therefore, the second chip 900 may be a memory semiconductor package (e.g., a semiconductor package having a high bandwidth memory (HBM) structure, but embodiments are no limited thereto. The second chip 900 is the same as that defined in the description of FIG. 8.

The interposer substrate 700 may include through vias 701. The through via 701 may contact a terminal of the second chip 900 and thus may electrically connect the interposer substrate 700 and the second chip 900. Interposer pads 703 and external terminals 705 attached to the interposer pads 703 may be disposed on a lower surface of the interposer substrate 700. A passivation layer that exposes the external terminals 705 and covers the interposer pads 703 may be formed.

The logic semiconductor package 600 may include a logic chip. The through via 701 may electrically connect the second chip 900 and the logic chip. Therefore, the second chip 900 may be connected to the logic chip of the logic semiconductor package 600 through the through vias 701. External terminals 607 may be formed on a lower surface of the logic semiconductor package 600, and thus the logic semiconductor package 600 may be electrically connected to other devices through the external terminals 607.

Figure 8:
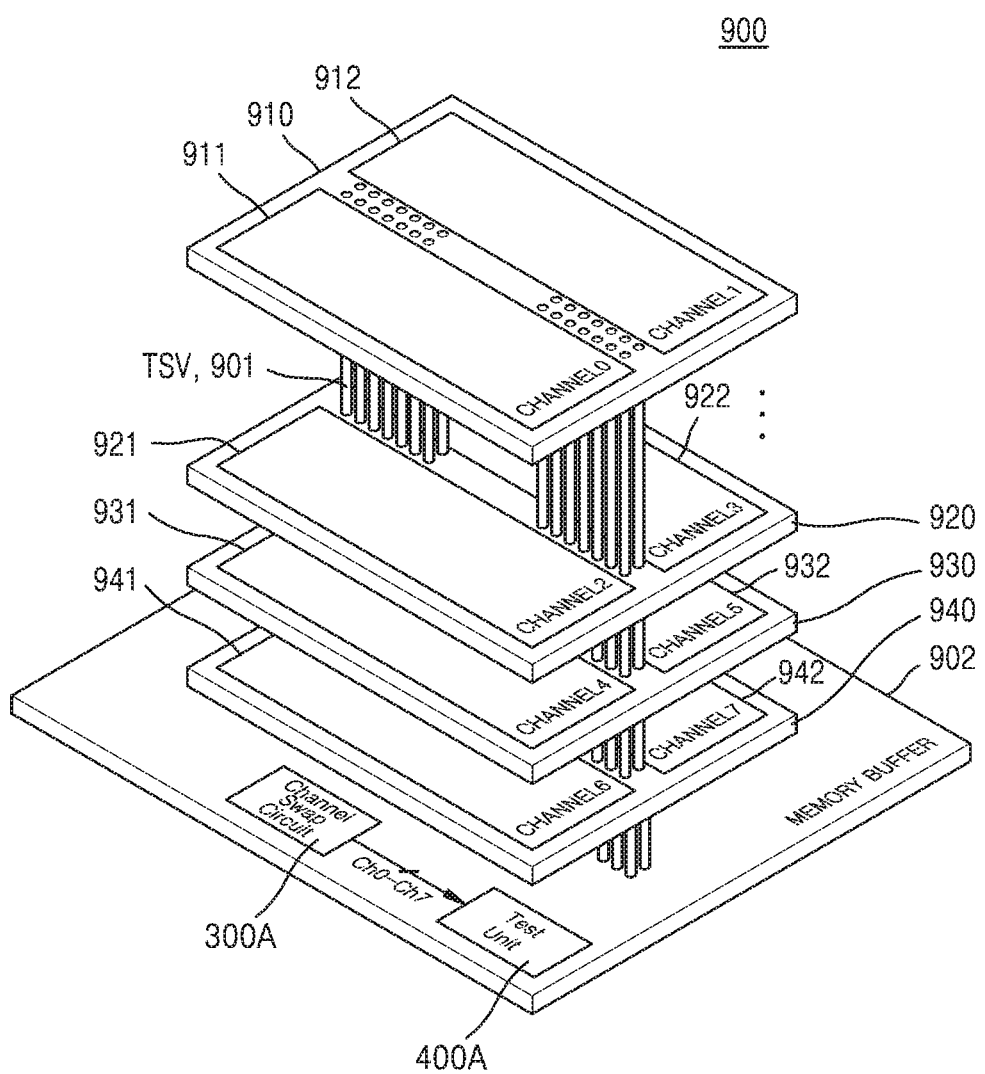
FIG. 8 is a view that illustrates a plurality of memory chips that constitute the central processing unit according to at least some example embodiments of the inventive concepts.

FIG. 8 is a view that illustrates a plurality of memory chips included in the central processing unit 1000 according to at least some example embodiments of the inventive concepts.

Referring to FIGS. 7A, 7B, and 8, the second chip 900 included in the plurality of memory chips may include first to fourth memory layers 910, 920, 930, and 940 that are stacked on each other. The first to fourth memory layers 910, 920, 930, and 940 may constitute a plurality of independent interfaces that are also referred to as "channels". Each of the first to fourth memory layers 910, 920, 930, and 940 may include two internal channels 911-912, 921-922, 931-932, and 941-942. Each of the first to eight internal channels 911, 912, 921, 922, 931, 932, 941, and 942 includes independent memory banks and may be independently clocked.

In one embodiment illustrated in FIG. 8, the second chip 900 provides an example of a configuration that is constituted of eight internal channels by stacking four memory layers 910, 920, 930, and 940. According to the embodiment, two to eight memory layers may be stacked in the second chip 900. Each of the first to fourth memory layers 910, 920, 930, and 940 may be constituted of one or four internal channels. Each of the first to fourth memory layers 910, 920, 930, and 940 may include a plurality of memory chips.

The second chip 900 may further include a memory buffer 902 at a lower part of the first to fourth memory layers 910, 920, 930, and 940. Therefore, the memory buffer 902 may be stacked on the interposer substrate 700 of the central processing unit 1000 of FIG. 7B.

The memory buffer 902 may receive command, address, clock, and data from a memory controller (e.g., the first chip 800 of FIG. 7A) from the outside of the memory buffer 902 and may provide a signal distribution function that provides the received command, address, clock, and data to the first to fourth memory layers 910, 920, 930, and 940. Since the memory buffer 902 buffers all the command, address, clock, and data, the memory controller may interface with the first to fourth memory layers 910, 920, 930, and 940 by only operating a load of the memory buffer 902.

The memory buffer 902 and the first to fourth memory layers 910, 920, 930, and 940 may be electrically connected by through silicon vias TSVs, 901 and may transmit and receive a signal with each other. The memory buffer 902 may communicate with the memory controller outside the memory buffer 902 through a conducting means formed on the outside of the second chip 900.

The memory buffer 902 may include a channel swap circuit 300A and a test unit 400A, however, at least some example embodiments of the inventive concepts are not limited thereto. The test unit 400A may not be formed in the memory buffer 902, and an embodiment may be configured such that a test on defects of the first fourth memory layers 910, 920, 930, and 940 in the second chip 900 from the outside of the second chip 900. In this case, first to eighth external channels ch0-ch7 may be formed on the interposer substrate 700 in FIG. 7B. For example, the first to eighth external channels may be formed on wires 709 formed in the interposer substrate 700 in FIG. 7B. The channel swap circuit 300A and the test unit 400A may perform the same functions with those of the line swap circuit 300 and the test unit 400 in FIGS. 1 to 4 or the line swap circuit 300 and the test unit 400 in. FIGS. 5 and 6.

The channel swap circuit 300A may connect first to eighth internal channels 911, 912, 921, 922, 931, 932, 941, and 942 to the first to eighth external channels ch0-ch7. When a driving signal of a first logic level is transmitted to the channel swap circuit 300A, the channel exchange circuit 300A may connect the first to eighth internal channels 911, 912, 921, 922, 931, 932, 941, and 942 to the first to eighth external channels ch0-ch7, respectively. When a driving signal having a second logic level that is different from the first logic level is transmitted to the channel swap circuit 300A, the channel swap circuit 300A may connect the first to eighth internal channels 911, 912, 921, 922, 931, 932, 941, and 942 and the first to eighth external channels ch0-ch7 in response to the driving signal.

In one embodiment, the channel swap circuit 300A may connect the first internal channel 911 to the third external channel ch2 and the third internal channel 921 to the first external channel ch0. That is, the channel swap circuit 300A may swap internal channels formed in the first memory layer 910 and the second memory layer 920 that are stacked adjacent and external channels connected to the internal channels, respectively. However, embodiments are not limited thereto, and the channel swap circuit 300A may swap the external channels that are respectively connected to the internal channels formed in memory layers that are not stacked adjacent. Also, when each of the memory layers are connected to the internal channels, the channel swap circuit 300A may swap the internal channels formed in the same memory layer and the external channels that are respectively connected to the internal channels.

The test unit 400A may include a test circuit, an error channel table memory, and a comparator. That is, the test unit 400A in. FIG. 8 may have the same configuration with that of the test unit 400 in FIG. 3. The test unit 400A may be connected to the line swap circuit 300A through the external channels ch0-ch7.

When a test mode is on, a test signal TS is transmitted to the test unit 400, and the test circuit may determine whether the first to eighth internal channels 911, 912, 921, 922, 931, 932, 941, and 942 have errors or not based on each of the first to eighth data transmitted from the external channels ch0-ch7. According to the results of the test, when error is detected, an additional test ay be performed, and a driving signal may be transmitted to the channel swap circuit 300A.

In particular, when a driving signal of a first logic level is transmitted to the channel swap circuit 300A, a first test for determining error occurrence in the first to eighth internal channels 911, 912, 921, 922, 931, 932, 941, and 942 may be performed based on each of the first to eighth data transmitted from the external channels ch0-ch7. After performing the first test, a driving signal of a second logic level may be transmitted to the channel swap circuit 300A, and at least some of the external channels ch0-ch7 may be swapped.

After the swapping, a second test for determining error occurrence in the first to eighth internal channels 911, 912, 921, 922, 931, 932, 941, and 942 may be performed based on each of the first to eighth data transmitted from the external channels ch0-ch7. After performing each of the first test and the second test, a test circuit 410A of the test unit 400A may sequentially store the results of the first test and the results of the second test in a table. After performing all of the first test and the second test, the results of the first test and the results of the second test that have been stored in the table may be compared to each other.

In one embodiment, it may be assumed that a result of an error occurred in data transmitted from the third external channel ch2 may be derived from the first test. After the first test, the external channels ch0-ch7 may be swapped to each other, and the first internal channel 911 may be connected to the third external channel ch2 and the third internal channel 921 to the first external channel ch0 by the channel swap circuit 300A. Thereafter, the second test may be performed.

When an error detected from the third external channel ch2 of the first test and an error detected from the first external channel ch0 of the second channel are identical to each other, the third internal channel 921 may be determined as having an error. On the other hand, when an error detected from the third external channel ch2 of the first test and an error detected from the first external channel ch0 of the second test are different from each other, an error detected from the third external channel ch2 of the first test may be determined as occurred due to an element other than the third internal channel 921.

Accordingly, when the error detected from an external channel n the first test and the error that has been monitored by an external channel in the second test are identical to each other as the result of comparing the results of the first test and the second test, the second chip 900 is determined as it includes an internal channel having an error, and the second chip 900 may be repaired by replacing the internal channel having an error with an extra internal channel.

Each of the channels 911, 912, 921, 922, 931, 932, 941, and 942 may construct an independent command and a data interface. Since the channels 911, 912, 921, 922, 931, 932, 941, and 942 are independent from each other, the description about one of the channels 911, 912, 921, 922, 931, 932, 941, and 942 may apply the same to the other channels.

In one embodiment, a plurality of memory layers 910, 920, 930, and 940 of the second chip 900 may each include the memory device 10 of FIG. 1 or the memory device 20 of FIG. 5. Therefore, a central processing unit 1000 according to at least one example embodiment of the inventive concepts may include both (i) the line swap circuit 300 in FIG. 1 or the line swap circuit 300 in FIG. 5, and (ii) the channel swap circuit 300A. In order to detect an accurate location of error occurred in the central processing unit 1000, a step of performing a test by driving the channel swap circuit 300A and a step of performing a test by driving the line swap circuit 300 in FIG. 1 or the line swap circuit 300 in FIG. 5 may be all performed.

However, at least some example embodiments of the inventive concepts are not limited to the example in which memory layers 910, 920, 930, and 940 of the second chip 900 each include the memory device 10 of FIG. 1 or the memory device 20 of FIG. 5. For example, according to at least some example embodiments of the inventive concepts, the plurality of memory layers 910, 920, 930, and 940 may not include the memory device 10 of FIG. 1 or the memory device 20 of FIG. 5.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A memory device comprising:
   a first memory cell array connected to a first internal data line;
   a second memory cell array connected to a second internal data line; and
   a line swap circuit configured to connect the first internal data line and the second internal data line with a first external data line and a second external data line based on a driving signal received from the outside,
   the line swap circuit being configured such that,
      when the driving signal has a first logic level, the line swap circuit connects the first internal data line to the first external data line and the second internal data line to the second external data line, and
      when the driving signal has a second logic level different from the first logic level, the line swap circuit swaps the first external data line and the second external data line so that the first internal data line is connected to the second external data line and the second internal data line is connected to the first external data line,
   wherein the first external data line and the second external data line respectively output data to the outside through different input/output pads,
   wherein the memory device further comprises a test unit configured to detect an error in data output through at least one of the first external data line and the second external data line, and
   wherein, the test unit is configured such that, when the driving signal has the first logic level, the test unit,
      performs a first test that includes determining whether the data output through the first and second external data lines includes an error,
      performs a second test that includes determining whether data output through the swapped first and second external data lines includes an error, and
      stores results of the first test and the second test.

2. The memory device of claim 1,
   wherein the line swap circuit is configured to operate in response to the driving signal that is provided from outside, and the driving signal is changed from the first logic level to the second logic level when an error is detected from data output through at least one of the first external data line and the second external data line.

3. The memory device of claim 1, wherein the test unit is configured to generate a repair signal based on an error detected from the second external data line while performing the first test and an error detected from the first external data line while performing the second test.

4. The memory device of claim 3, further comprising:
   a repair circuit; and
   a memory cell array for redundancy repair,
   wherein the repair circuit is configured to repair an error cell of the second memory cell array using the memory cell array for redundancy repair, based on the repair signal.

5. The memory device of claim 1, wherein the test unit is configured to determine that the second memory cell array does not have an error cell when the test unit does not detect an error in data output through the first external data line when the second test is performed.

6. The memory device of claim 1
   wherein each of the first and second internal data lines and the first and second external data lines has a number of lines that corresponds to a burst length.

7. The memory device of claim 1, wherein the first memory cell array and the second memory cell array are included in the same memory bank.

8. A memory device comprising:
   a first memory cell array connected to a first internal data line;
   a second memory cell array connected to a second internal data line; and
   a line swap circuit configured to,
      receive a driving signal,
      connect the first internal data line to a first external data line and the second internal data line to a second external data line based on the driving signal, and
      swap the connections of the first and second internal data lines such that the first and second internal data lines are connected to the second and first external data lines, respectively, based on the driving signal,
   wherein the first external data line and the second external data line respectively output data to the outside through different input/output pads,
   wherein the line swap circuit is configured to operate in response to the driving signal that is provided from outside, and the driving signal is changed from a first logic level to a second logic level when an error is detected from data output through at least one of the first external data line and the second external data line,
   wherein the memory device further comprises a test unit configured to detect an error in data output through at least one of the first external data line and the second external data line, and
   wherein, the test unit is configured such that, when the driving signal has the first logic level, the test unit,
      performs a first test that includes determining whether the data output through the first and second external data lines includes an error,
      performs a second test that includes determining whether data output through the swapped first and second external data lines includes an error, and
      stores results of the first test and the second test.

9. The memory device of claim 8, wherein the test unit is configured to generate a repair signal based on an error detected from the second external data line while performing the first test and an error detected from the first external data line while performing the second test.

10. The memory device of claim 9, further comprising:
    a repair circuit; and
    a memory cell array for redundancy repair,
    wherein the repair circuit is configured to repair an error cell of the second memory cell array using the memory cell array for redundancy repair, based on the repair signal.

* * * * *